(12) United States Patent
Kihara et al.

(10) Patent No.: US 7,961,031 B2
(45) Date of Patent: Jun. 14, 2011

(54) SEMICONDUCTOR SWITCH CIRCUIT

(75) Inventors: Hideyuki Kihara, Kanagawa (JP);
Tomohiro Ukai, Kanagawa (JP);
Kiyotaka Inagaki, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/776,459

(22) Filed: May 10, 2010

(65) Prior Publication Data
US 2010/0219878 A1    Sep. 2, 2010

Related U.S. Application Data

(62) Division of application No. 11/941,365, filed on Nov. 16, 2007, now Pat. No. 7,741,895.

(30) Foreign Application Priority Data

Nov. 20, 2006   (JP) ................................. 2006-313475

(51) Int. Cl.
*H03K 17/687* (2006.01)
(52) U.S. Cl. ........ 327/427; 327/434; 327/437; 327/534; 327/536; 327/537
(58) Field of Classification Search .................. 327/423, 327/427, 429, 536
See application file for complete search history.

(56) References Cited

U.S. PATENT DOCUMENTS

| | | | | |
|---|---|---|---|---|
| 6,046,626 A | * | 4/2000 | Saeki et al. | ................... 327/536 |
| 2004/0174203 A1 | | 9/2004 | Wodnicki | |
| 2005/0264341 A1 | | 12/2005 | Hikita et al. | |

FOREIGN PATENT DOCUMENTS

| | | |
|---|---|---|
| JP | 63-227215 | 9/1988 |
| JP | 2000-77963 | 3/2000 |
| JP | 2000-341144 | 12/2000 |

* cited by examiner

*Primary Examiner* — Lincoln Donovan
*Assistant Examiner* — John W Poos
(74) *Attorney, Agent, or Firm* — Greenblum & Bernstein, P.L.C.

(57) ABSTRACT

A semiconductor switch circuit is provided that enables current consumption to be reduced even in a conduction state. A semiconductor switch circuit 100 has P-type MOS transistors Q101 and Q102 for conduction that share a source and are connected in series between an input/output terminal 101 and input/output terminal 102, a P-type MOS transistor Q103 and N-type MOS transistor Q105 having drains connected to the gate of Q101, a P-type MOS transistor Q104 and N-type MOS transistor Q106 having drains connected to the gate of Q102, and a control terminal 103 connected to the gates of the transistors. Further semiconductor switch circuit 100 is configured with the sources and back gates of Q103 and Q104 connected to the sources of Q101 and Q102. Therefore, it is possible to switch the path between input/output terminal 101 and input/output terminal 102 between a conduction state and non-conduction state by means of voltage control by voltage value Vcont of a control signal applied to control terminal 103.

6 Claims, 3 Drawing Sheets

SEMICONDUCTOR SWITCH CIRCUIT

CROSS REFERENCE TO RELATED APPLICATIONS

This is a divisional application of pending U.S. patent application Ser. No. 11/941,365, filed Nov. 16, 2007, which claims priority to Japanese Application No. 2006-313475 filed on Nov. 20, 2006, the contents of which are expressly incorporated herein by reference in their entireties.

BACKGROUND OF THE INVENTION

1. Field of the Invention

The present invention relates to a semiconductor switch circuit used in a semiconductor integrated circuit. More particularly, the present invention relates to a semiconductor switch circuit that controls a conduction state and non-conduction state with low current consumption.

2. Description of the Related Art

The USB (Universal Serial Bus) is attracting attention as an interface standard for connecting a personal computer and peripheral devices. The USB transfers serial data using two signal lines, and a USB connector is connected to first and second signal lines for serial transmission of data, and a power supply IC for supplying power.

A semiconductor switch circuit is utilized as a semiconductor integrated circuit used in a USB connector and the like. A semiconductor switch circuit using MOS transistors is a typical analog signal switching means. The semiconductor switch circuit described in Patent Document 1 is a conventional semiconductor switch circuit.

FIG. 1 is a circuit diagram of the semiconductor switch circuit described in Patent Document 1, and the semiconductor switch circuit is an analog switch circuit used in a power supply IC.

In FIG. 1, semiconductor switch circuit 10 is configured with switch terminals 11 and 12, control terminals 13 and 14, a current mirror circuit Q20 configured with an N-type MOS transistor Q20a and N-type MOS transistor Q20b to which a source is grounded, a P-type MOS transistor Q21 for current supply that performs conduction control of current mirror circuit Q20, P-type MOS transistors Q22 and Q23 connected in series between switch terminals 11 and 12, and a resistance 24 connected between the gates and sources of P-type MOS transistors Q22 and Q23.

The operation of semiconductor switch circuit 10 configured as described above will now be explained.

P-type MOS transistor Q21 and current mirror circuit Q20 constitute a control system that controls the conduction state/non-conduction state of P-type MOS transistors Q22 and Q23 connected in series between switch terminals 11 and 12. When it is wished to establish conduction between switch terminals 11 and 12, a control signal applied to P-type MOS transistor Q21 gate control terminal 14 is driven low. As a result, P-type MOS transistor Q21 is turned on, and a drain current starts to flow, and this drain current is mirrored by current mirror circuit Q20 configured with N-type MOS transistors Q20a and Q20b. The drain potential of N-type MOS transistor Q20b tends to draw in current at the point of connection of P-type MOS transistors Q22 and Q23 via resistance 24, the gate potential of P-type MOS transistors Q22 and Q23 becomes 0 V. Consequently, P-type MOS transistors Q22 and Q23 enter a conduction state, a signal flows between switch terminals 11 and 12, and thereby switch-on is implemented.

On the other hand, when it is wished to establish a non-conduction state between switch terminals 11 and 12, the level of a control signal applied to control terminal 14 that is connected to the gate of P-type MOS transistor Q21 is made high. As a result, P-type MOS transistor Q21 is turned off, a current does not flow to current mirror circuit Q20 connected to the drain of P-type MOS transistor Q21, and current mirror circuit Q20 is turned off. As the gates of P-type MOS transistors Q22 and Q23 located between switch terminals 11 and 12 are both connected to the source of current mirror circuit Q20 via resistance 24, P-type MOS transistors Q22 and Q23 are connected in series in opposite directions. Therefore, a parasitic diode D11 of P-type MOS transistor Q22 and a parasitic diode D12 of P-type MOS transistor Q23 are connected in series in opposite directions, a non-conduction state is established between switch terminals 11 and 12, and switch-off is implemented.

If resistance 24 is not provided, upon switch-off, the gates of P-type MOS transistors Q22 and Q23 would not be connected simultaneously to the source of N-type MOS transistor Q20b, and the gate potentials of P-type MOS transistors Q22 and Q23 would float. That is to say, an unstable state would occur in which the P-type MOS transistors are turned on or turned off according to the gate potentials of P-type MOS transistors Q22 and Q23. By providing resistance 24 between the gates and sources of P-type MOS transistors Q22 and Q23, a state in which P-type MOS transistors Q22 and Q23 are connected in series in opposite directions—a state in which parasitic diodes D11 and D12 are connected in series in opposite directions—is realized, and a non-conduction state is reliably established upon switch-off.

However, with this kind of conventional semiconductor switch circuit, in order to establish conduction for P-type MOS transistors Q22 and Q23 formed between switch terminals 11 and 12, it is necessary to cause a current to flow from current mirror circuit Q20 to resistance 24 connected between the gates and sources of these P-type MOS transistors Q22 and Q23 and generate a potential difference in resistance 24. That is to say, a current is necessary to place semiconductor switch circuit 10 in the non-conduction state, and that current flows from a switch terminal, and therefore there is a problem that an excess leakage current flows from one of switch terminal 11 and switch terminal 12, which has the higher potential, and current consumption increases. Patent Document 1: Japanese Patent Application Laid-Open No. SHO 63-227215

SUMMARY OF THE INVENTION

It is an object of the present invention to provide a semiconductor switch circuit that enables current consumption to be reduced even in a conduction state.

The present invention achieves the above object by employing a configuration that includes: first and second MOS transistors for conduction that share a source and are connected in series between a first input/output terminal and second input/output terminal; third and fifth MOS transistors having drains connected to the gate of the first MOS transistor; fourth and sixth MOS transistors having drains connected to the gate of the second MOS transistor; and a control terminal connected to the gates of the third through sixth MOS transistors, wherein the sources and back gates of the third and fourth MOS transistors are connected to the sources of the first and second MOS transistors.

DETAILED DESCRIPTION OF THE PREFERRED EMBODIMENTS

With reference now to the accompanying drawings, embodiments of the present invention will be explained in detail below.

Embodiment 1

Figure 2:
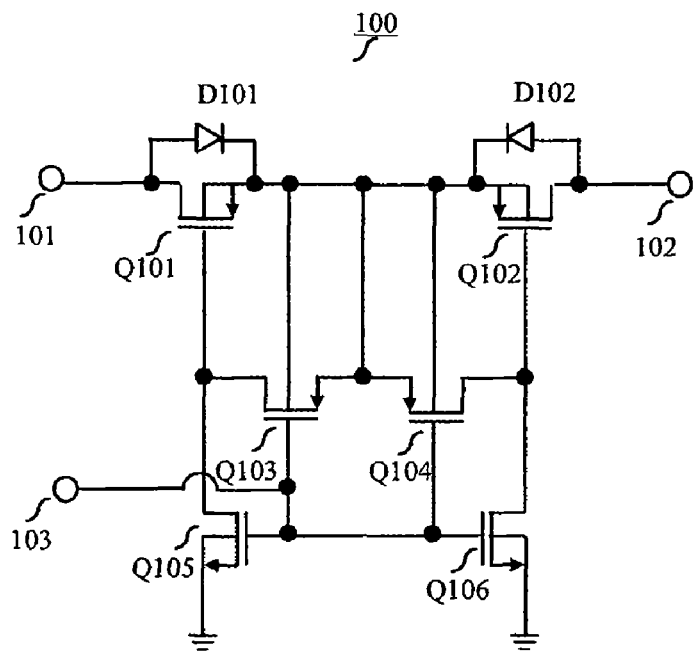
FIG. 2 is a circuit diagram showing the configuration of a semiconductor switch circuit according to Embodiment 1 of the present invention.

FIG. 2 is a circuit diagram showing the configuration of a semiconductor switch circuit according to Embodiment 1 of the present invention. This embodiment is an example of application of the present invention to a semiconductor switch circuit connected to a power supply IC that receives USB data.

In FIG. 2, semiconductor switch circuit 100 is configured with input/output terminals 101 and 102, a control terminal 103, P-type MOS transistors Q101, Q102, Q103 and Q104, and N-type MOS transistors Q105 and Q106.

Input/output terminals 101 and 102 are switch terminals of semiconductor switch circuit 100.

Control terminal 103 controls the conduction state/non-conduction state of semiconductor switch circuit 100.

Input/output terminal 101 is connected to the drain of P-type MOS transistor Q101, and input/output terminal 102 is connected to the drain of P-type MOS transistor Q102. The sources and back gates of P-type MOS transistors Q101 and Q102, and the sources and back gates of P-type MOS transistors Q103 and Q104, are respectively commonly connected. The gate of P-type MOS transistor Q101, the drain of P-type MOS transistor Q103, and the drain of N-type MOS transistor Q105 are commonly connected, and the gate of P-type MOS transistor Q102, the drain of P-type MOS transistor Q104, and the drain of N-type MOS transistor Q106 are commonly connected. Furthermore, the gates of P-type MOS transistors Q103 and Q104 and N-type MOS transistors Q105 and Q106, and the control terminal, are commonly connected. The sources and back gates of N-type MOS transistors Q105 and Q106 are each grounded. Control terminal 103 is commonly connected to the gates of P-type MOS transistors Q103 and Q104 and the gates of N-type MOS transistors Q105 and Q106.

From a functional viewpoint, semiconductor switch circuit 100 is configured with P-type MOS transistors Q101 and Q102 for conduction connected in series between input/output terminal 101 and input/output terminal 102, P-type MOS transistors Q103 and Q104 configuring a source follower that controls the gate potential of P-type MOS transistors Q101 and Q102, and N-type MOS transistors Q105 and Q106 that control the gate potential of aforementioned P-type MOS transistors Q103 and Q104.

Control terminal 103 is connected to the gates of P-type MOS transistors Q103 and Q104 configuring the aforementioned source follower and the gates of N-type MOS transistors Q105 and Q106, and the sources and back gates of P-type MOS transistors Q103 and Q104 are connected to the sources and back gates of P-type MOS transistors Q101 and Q102.

Also, when viewed from the point of connection of P-type MOS transistors Q101 and Q102 for conduction, P-type MOS transistors Q103 and Q104 and N-type MOS transistors Q105 and Q106 are configured with P-type MOS transistors Q103 and Q104 and N-type MOS transistors Q105 and Q106 respectively arranged symmetrically.

To take a different viewpoint, P-type MOS transistor Q103 and N-type MOS transistor Q105, and P-type MOS transistor Q104 and N-type MOS transistor Q106, configure CMOS-structure inverter gates INV1 and INV2, respectively, and these inverter gates INV1 and INV2 have their inputs mutually commonly connected, and control terminal 103 is connected to their common input terminal.

Figure 3:
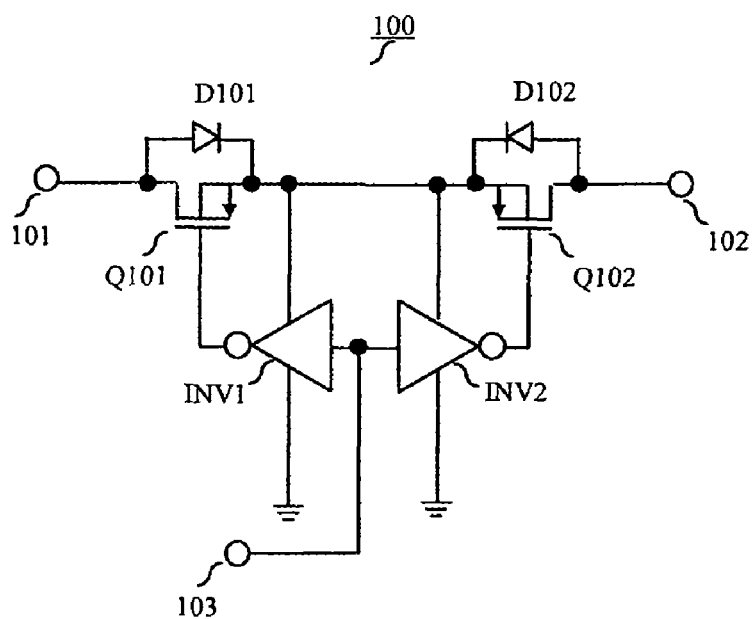
FIG. 3 is a circuit diagram showing the configuration of another semiconductor switch circuit according to Embodiment 1.

FIG. 3 is a circuit diagram showing the configuration of a semiconductor switch circuit when semiconductor switch circuit 100 shown in FIG. 2 is configured using inverter gates.

In FIG. 3, semiconductor switch circuit 100 is configured with input/output terminals 101 and 102, P-type MOS transistors Q101 and Q102 sharing a source and connected in series between input/output terminal 101 and input/output terminal 102, inverter gates INV1 and INV2, and control terminal 103 connected to the inputs of inverter gates INV1 and INV2.

Inverter gate INV1 is a single-stage CMOS gate to which the drains and gates of P-type MOS transistor Q103 and N-type MOS transistor Q105 are respectively commonly connected, and inverter gate INV2 is a single-stage CMOS gate to which the drains and gates of P-type MOS transistor Q104 and N-type MOS transistor Q106 are respectively commonly connected.

The output of inverter gate INV1 is connected to the gate of P-type MOS transistor Q101, and the output of inverter gate INV2 is connected to the gate of P-type MOS transistor Q102. Also, the high-potential-side power supply of inverter gate INV1 is connected to the source of P-type MOS transistor Q101, the high-potential-side power supply of inverter gate INV2 is connected to the source of P-type MOS transistor Q102, and the low-potential-side power supplies of inverter gates INV1 and INV2 are grounded. Control terminal 103 is connected to the inputs of inverter gate INV1 and inverter gate INV2.

The operation of semiconductor switch circuits 100 configured as described above will now be explained. First, the operation of semiconductor switch circuit 100 shown in FIG. 2 will be described.

First, when a voltage is applied to input/output terminal 101 and input/output terminal 102 is in the non-input state, the source potential of commonly connected P-type MOS transistors Q101 and Q102 becomes a value dropping from the potential of input/output terminal 101 by a voltage drop of parasitic diode D101 of P-type MOS transistor Q101.

When 0 V is applied to control terminal 103 in this state, P-type MOS transistors Q103 and Q104 are turned on, and the sources of N-type MOS transistors Q105 and Q106 are grounded, and therefore N-type MOS transistors Q105 and Q106 are turned off. At this time, the sources and gates of P-type MOS transistors Q101 and Q102 are shorted, and therefore a non-conduction state is established between input/output terminals 101 and 102, and a switch-off state is realized. In this state, in particular, a control current does not flow to P-type MOS transistors Q103 and Q104 or N-type MOS transistors Q105 and Q106. Therefore, a non-conduction state can be reliably established between input/output terminals 101 and 102 even if a control signal ceases to be applied to control terminal 103, for instance, due to unforeseen circumstances or the like.

On the other hand, when a voltage greater than or equal to threshold voltages $t_{Q105}$ and $t_{Q106}$ of N-type MOS transistors Q105 and Q106 is applied to control terminal 103, N-type MOS transistors Q105 and Q106 are turned on, and a drain current flows to the gates of P-type MOS transistors Q101 and Q102. As a result, the level of the gate potential of P-type MOS transistors Q101 and Q102 becomes low, P-type MOS transistors Q101 and Q102 are turned on, a conduction state is established between input/output terminals 101 and 102, and a switch-on state is realized.

In the above-described conduction state, as shown in equation 1 below, unless a voltage exceeding threshold voltages $Vt_{Q103}$ and $Vt_{Q104}$ of P-type MOS transistors Q103 and Q104 is applied to control terminal 103, a path on which a control current flows is not created between input/output terminals 101 and 102 even if P-type MOS transistors Q103 and Q104 have been turned on, and therefore a leakage current does not flow and unnecessary power consumption does not occur. In equation 1, Vin represents the potential difference between input/output terminals 101 and 102, and Vcont represents the voltage of the control signal applied to control terminal 103.

$$Vin > Vcont + Vt_{Q103}, Vin > Vcont + Vt_{Q104} \qquad \text{(Equation 1)}$$

In other words, even if voltage Vcont applied to control terminal 103 is 0 V, a leakage current will not flow between input/output terminals 101 and 102 unless potential difference Vin between input/output terminals 101 and 102 exceeds threshold voltages $Vt_{Q103}$ and $Vt_{Q104}$ of P-type MOS transistors Q103 and Q104.

That is to say, P-type MOS transistors Q103 and Q104 configure a source follower, and the source follower does not depend on an input voltage. The gate potential of P-type MOS transistors Q103 and Q104 configuring this source follower is controlled by N-type MOS transistors Q105 and Q106, unless a control signal that exceeds the source potential of P-type MOS transistors Q103 and Q104 is applied to control terminal 103 connected to the gates of P-type MOS transistors Q103 and Q104, a control current does not flow to P-type MOS transistors Q103 and Q104, and current consumption can be suppressed.

Here, semiconductor switch circuit 100 according to this embodiment as shown in FIG. 2 is configured with P-type MOS transistors Q101 and Q102 connected in series in opposite directions between input/output terminal 101 and input/output terminal 102, and therefore parasitic diodes D101 and D102 are connected in series in opposite directions. By means of these parasitic diodes D101 and D102, it is possible to prevent a countercurrent flowing in from input/output terminal 101 and a countercurrent flowing in from input/output terminal 102.

Next, the operation of semiconductor switch circuit 100 shown in FIG. 3 will be described.

As in the case of semiconductor switch circuit 100 shown in FIG. 2, when a voltage is applied to input/output terminal 101 and input/output terminal 102 is in the non-input state, the source potential of commonly connected P-type MOS transistors Q101 and Q102 becomes a value dropping from the potential of input/output terminal 101 by a voltage drop of parasitic diode D101 of P-type MOS transistor Q101.

When 0 V is applied to control terminal 103 in this state, inverter gate INV1 outputs a voltage equal to the source potential of P-type MOS transistor Q101 connected to the high-potential-side power supply of inverter gate INV1 to the gate of P-type MOS transistor Q101. Similarly, inverter gate INV2 outputs a voltage equal to the source potential of P-type MOS transistor Q102 connected to the high-potential-side power supply of inverter gate INV2 to the gate of P-type MOS transistor Q102. As a result, the source potential and gate potential of P-type MOS transistors Q101 and Q102 become equal and the sources and gates are shorted, and therefore a non-conduction state is established between input/output terminals 101 and 102, and a switch-off state is realized.

On the other hand, when a positive voltage is applied to control terminal 103, 0 V is output from inverter gates INV1 and INV2 to P-type MOS transistors Q101 and Q102, respectively. The gate potential of P-type MOS transistors Q101 and Q102 becomes lower than the source potential, P-type MOS transistors Q101 and Q102 are turned on, a conduction state is established between input/output terminals 101 and 102, and a switch-on state is realized.

As described above, according to this embodiment, semiconductor switch circuit 100 has first and second P-type MOS transistors Q101 and Q102 for conduction that share a source and are connected in series between a first input/output terminal 101 and second input/output terminal 102, a third P-type MOS transistor Q103 and fifth N-type MOS transistor Q105 having drains connected to the gate of first P-type MOS transistor Q101, a fourth P-type MOS transistor Q104 and sixth N-type MOS transistor Q106 having drains connected to the gate of second P-type MOS transistor Q102, and a control terminal 103 connected to the gates of the third through sixth MOS transistors. Further, semiconductor switch circuit 100 is configured with the sources and back gates of third and fourth P-type MOS transistors Q103 and Q104 connected to the sources of first and second P-type MOS transistors Q101 and Q102. Therefore, it is possible to switch the path between input/output terminal 101 and input/output terminal 102 between a conduction state and non-conduction state by means of voltage control by voltage value Vcont of a control signal applied to control terminal 103.

That is to say, in the example of the prior art, a resistance 24 is provided to ensure stable operation of the control transistors during conduction, and this increases current consumption. In contrast, in this embodiment, the conduction/non-conduction state of the semiconductor switch circuit is controlled by means of voltage control, so that it is possible to reduce power consumption. Also, as in the example of the prior art, a non-conduction state can be maintained reliably between input/output terminal 101 and input/output terminal 102 even when a control signal ceases to be applied to control terminal 103.

Also, semiconductor switch circuit 100 according to this embodiment has an extremely simple circuit configuration including P-type MOS transistors Q103 and Q104 and N-type MOS transistors Q105 and Q106, and therefore has an effect of enabling easy implementation with a small number of component parts.

To further explain the control signal applied to control terminal 103, semiconductor switch circuit 100 has P-type MOS transistors Q101 and Q102 connected in series between input/output terminal 101 and input/output terminal 102, P-type MOS transistors Q103 and Q104 configuring a source follower that controls the gate potential of P-type MOS transistors Q101 and Q102, and N-type MOS transistors Q105 and Q106 that control the gate potential of aforementioned P-type MOS transistors Q103 and Q104, and unless a control signal that exceeds the source potential of P-type MOS transistors Q103 and Q104 is applied to control terminal 103 connected to the gates of P-type MOS transistors Q103 and Q104, a control current does not flow to P-type MOS transistors Q103 and Q104, and current consumption can be suppressed. Also, unless the gate potential of P-type MOS transistors Q103 and Q104 exceeds the source potential of P-type MOS transistors Q103 and Q104, a conduction/non-conduction state can be maintained stably between input/output terminal 101 and input/output terminal 102 even if the control signal applied to control terminal 103 fluctuates.

To further explain the CMOS inverter gate structure, semiconductor switch circuit 100 is provided with P-type MOS transistors Q101 and Q102 connected in series between input/output terminal 101 and input/output terminal 102, CMOS-structure inverter gate INV1 configured with P-type MOS transistor Q103 and N-type MOS transistor Q105, and CMOS-structure inverter gate INV2 configured with P-type MOS transistor Q104 and N-type MOS transistor Q106, and by applying a control signal to control terminal 103 connected to the input terminals of inverter gates INV1 and INV2 and controlling inverter gates INV1 and INV2, the gate potentials of P-type MOS transistors Q101 and Q102 connected in series between input/output terminals 101 and 102 are controlled, and the path between input/output terminals 101 and 102 is switched between a conduction state and non-conduction state. That is to say, the control system is entirely of a CMOS inverter gate structure, so that it is possible to implement a semiconductor switch circuit with extremely low current consumption.

A case has been described above in which inverter gates INV1 and INV2 have a CMOS gate single-stage configuration, but there are no particular restrictions on the number or type of CMOS gates as long as the configuration functions as an inverter gate with respect to control terminal 103. For example, the same operation is also possible if inverter gates INV1 and INV2 are configured with NOR gates, NAND gates, or the like.

Embodiment 2

Figure 4:
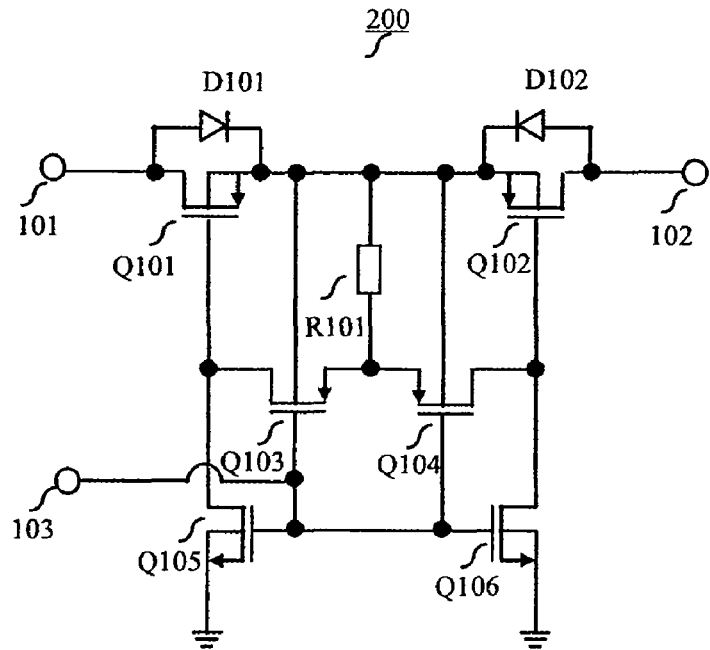
FIG. 4 is a circuit diagram showing the configuration of a semiconductor switch circuit according to Embodiment 2 of the present invention.

FIG. 4 is a circuit diagram showing the configuration of a semiconductor switch circuit according to Embodiment 2 of the present invention. In the description of this embodiment, components that are the same as those in FIG. 2 are assigned the same reference numerals without further explanations.

In FIG. 4, semiconductor switch circuit 200 is configured with input/output terminals 101 and 102, control terminal 103, P-type MOS transistors Q101, Q102, Q103, and Q104, N-type MOS transistors Q105 and Q106, and a resistance R101.

The back gates and sources of P-type MOS transistors Q101 and Q102 and the back gates of P-type MOS transistors Q103 and Q104 are commonly connected to one side of resistance R101, and the sources of P-type MOS transistors Q103 and Q104 are commonly connected to the other side of resistance R101.

The operation of semiconductor switch circuit 200 configured as described above will now be explained. The operation of semiconductor switch circuit 200 is basically the same as the operation of semiconductor switch circuit 100. The following operation results from the addition of resistance R101.

When a control signal Vcont exceeding threshold voltages $Vt_{Q105}$ and $Vt_{Q106}$ of N-type MOS transistor Q105 and Q106 is applied to control terminal 103, as shown in equation 2, N-type MOS transistors Q105 and Q106 are turned on.

$$\text{Vcont} > Vt_{Q105}, \text{Vcont} > Vt_{Q106} \quad \text{(Equation 2)}$$

Also, when Vin, Vcont, $Vt_{Q103}$ and $Vt_{Q104}$ satisfy the relationship in equation 3, P-type MOS transistors Q103 and Q104 are turned on.

$$Vin-Vcont > Vt_{Q103}, Vin-Vcont > Vt_{Q104} \quad \text{(Equation 3)}$$

That is to say, when Vin, Vcont, $Vt_{Q103}$, $Vt_{Q104}$, $Vt_{Q105}$ and $Vt_{Q106}$ satisfy the relationship in equation 4, all the MOS transistors configuring semiconductor switch circuit 200 are turned on. At this time, if semiconductor switch circuit 200 does not have resistance R101, there would be a possibility of an indeterminate region occurring.

$$\max(Vt_{Q105}, Vt_{Q106}) < Vcont < Vin - \max(Vt_{Q103}, Vt_{Q104}) \quad \text{(Equation 4)}$$

On the other hand, when semiconductor switch circuit 200 is configured including resistance R101, current $I_{Q103-Q105}$ flowing through resistance R101 from P-type MOS transistor Q103 to N-type MOS transistor Q105 and current $I_{Q104-Q106}$ flowing through resistance R101 from P-type MOS transistor Q104 to N-type MOS transistor Q106 are as shown in equation 5 and equation 6.

$$I_{Q103-Q105} = (Vin - Vcont - Vt_{Q103})/R \quad \text{(Equation 5)}$$

$$I_{Q104-Q106} = (Vin - Vcont - Vt_{Q104})/R \quad \text{(Equation 6)}$$

In equation 5 and equation 6, R represents the resistance value of R101.

Thus, when all the MOS transistors are turned on in the conduction state, currents $I_{Q103-Q105}$ and $I_{Q104-Q106}$ such as shown in equation 5 or equation 6 flow from P-type MOS transistors Q103 and Q104 to N-type MOS transistors Q105 and Q106, and therefore the conduction state is stable and an aforementioned indeterminate region is eliminated.

As described above, according to this embodiment, semiconductor switch circuit 200 is configured with resistance R101 added between the sources of P-type MOS transistors Q101 and Q102 and the sources of P-type MOS transistors Q103 and Q104, so that, when P-type MOS transistors Q101 through Q104 and N-type MOS transistors Q105 and Q106 are all turned on, it is possible to avoid the occurrence of an indeterminate region and create a stable conduction state.

Embodiment 3

Figure 5:
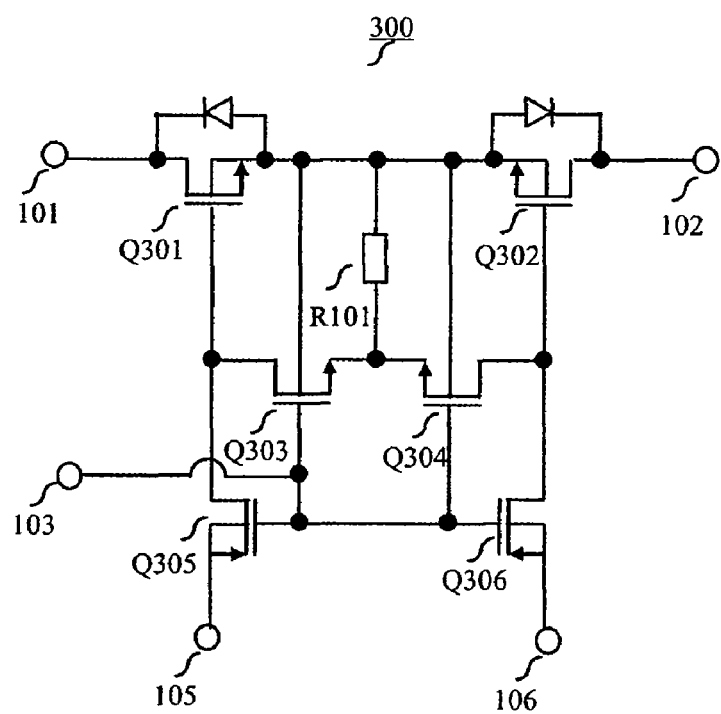
FIG. 5 is a circuit diagram showing the configuration of a semiconductor switch circuit according to Embodiment 3 of the present invention.

FIG. 5 is a circuit diagram showing the configuration of a semiconductor switch circuit according to Embodiment 3 of the present invention. This embodiment can be applied to a semiconductor switch circuit that uses negative logic, such as the power supply side of an operational amplifier, for example. In the description of this embodiment, components that are the same as those in FIG. 4 are assigned the same reference numerals without further explanations.

In FIG. 5, semiconductor switch circuit 300 is configured with N-type MOS transistors Q301 and Q302 for conduction connected in series between input/output terminal 101 and input/output terminal 102, N-type MOS transistors Q303 and Q304 that control the gate potential of N-type MOS transistors Q303 and Q304, P-type MOS transistors Q305 and Q306 that control the gate potential of aforementioned N-type MOS transistors Q303 and Q304, and resistance R101.

That is to say, semiconductor switch circuit 300 is configured with P-type MOS transistors Q101 through Q104 of semiconductor switch circuit 200 replaced by N-type MOS transistors Q301 through Q304, and N-type MOS transistors Q105 and Q106 replaced by P-type MOS transistors Q305 and Q306.

Input/output terminals 101 and 102 are switch terminals of semiconductor switch circuit 300.

Control terminal 103 controls the conduction state/non-conduction state of semiconductor switch circuit 300.

Power supply terminals 105 and 106 control the source potential of P-type MOS transistors Q305 and Q306.

Input/output terminal 101 is connected to the drain of N-type MOS transistor Q301, and input/output terminal 102 is connected to the drain of N-type MOS transistor Q302. The sources and back gates of N-type MOS transistors Q301 and Q302, and the sources and back gates of N-type MOS transistors Q303 and Q304, are respectively commonly connected. The gate of N-type MOS transistor Q301, the drain of N-type MOS transistor Q303, and the drain of P-type MOS transistor Q305 are commonly connected, and the gate of N-type MOS transistor Q302, the drain of N-type MOS transistor Q304, and the drain of P-type MOS transistor Q306 are commonly connected. Furthermore, the gates of N-type MOS transistors Q303 and Q304 and P-type MOS transistors Q305 and Q306, and the control terminal, are commonly connected. The sources and back gates of P-type MOS transistors Q305 and Q306 are each grounded. Control terminal 103 is commonly connected to the gates of N-type MOS transistors Q303 and Q304 and the gates of P-type MOS transistors Q305 and Q306. Resistance R101 is located between the sources of N-type MOS transistors Q301 and Q302 and the sources of N-type MOS transistors Q303 and Q304.

The operation of semiconductor switch circuit 300 configured as described above is basically the same as the operation of semiconductor switch circuit 200. Whereas semiconductor switch circuit 200 creates a conduction state between input/output terminal 101 and input/output terminal 102 by applying a positive voltage to the control terminal, semiconductor switch circuit 300 creates a conduction state between input/output terminal 101 and input/output terminal 102 by applying a negative voltage to the control terminal.

As described above, according to this embodiment, semiconductor switch circuit 300 has first and second N-type MOS transistors Q301 and Q302 for conduction that share a source and are connected in series between a first input/output terminal 101 and second input/output terminal 102, a third N-type MOS transistor Q303 and fifth P-type MOS transistor Q305 having drains connected to the gate of first N-type MOS transistor Q301, a fourth N-type MOS transistor Q304 and sixth P-type MOS transistor Q306 having drains connected to the gate of second N-type MOS transistor Q302, a resistance R101 between the sources of N-type MOS transistors Q301 and Q302 and the sources of N-type MOS transistors Q303 and Q304, a control terminal 103 connected to the gates of the third through sixth MOS transistors, and power supply terminals 105 and 106 connected to fifth and sixth P-type MOS transistors Q305 and Q306, respectively. Further, semiconductor switch circuit 300 is configured with the sources and back gates of third and fourth N-type MOS transistors Q303 and Q304 connected to the sources of first and second N-type MOS transistors Q301 and Q302. Therefore, it is possible to switch the path between input/output terminal 101 and input/output terminal 102 between a conduction state and non-conduction state by means of voltage control by voltage value Vcont of a control signal applied to control terminal 103. By this means, when N-type MOS transistors Q301 through Q304 and P-type MOS transistors Q305 and Q306 are all turned on, it is possible to avoid the occurrence of an indeterminate region and create a stable conduction state.

Embodiment 1 and Embodiment 2 provide semiconductor switch circuits featuring excellent current consumption when a conduction state is established between input/output terminal 101 and input/output terminal 102 by applying a positive voltage to control terminal 103. In Embodiment 3, a conduction state is established between input/output terminal 101 and input/output terminal 102 by applying a negative voltage to control terminal 103. Negative-logic semiconductor switch circuit 300 whereby a conduction state is established between input/output terminal 101 and input/output terminal 102 by applying a negative voltage to control terminal 103 can also be implemented easily.

This kind of negative-logic semiconductor switch circuit 300 is suitable, for example, for an analog switch circuit used when it is difficult to make the output low level approach zero, and a ±5 V positive power supply and negative power supply are provided, as in the case of an operational amplifier or the like.

Implementation is also possible for a semiconductor switch circuit configured with MOS transistors with an SOI (Silicon On Insulator) structure, as well as MOS transistors configured on a normal silicon substrate.

The above descriptions are illustrations of preferred embodiments of the present invention, and the scope of the present invention is not limited to these. For example, in the above embodiments, examples have been described in which MOS transistors are used, but the transistors may be of any kind, and bipolar transistors, Bi-CMOS, or a combination thereof, may be used. However, it goes without saying that MOS transistors are advantageous from the standpoint of power consumption.

Figure 1:
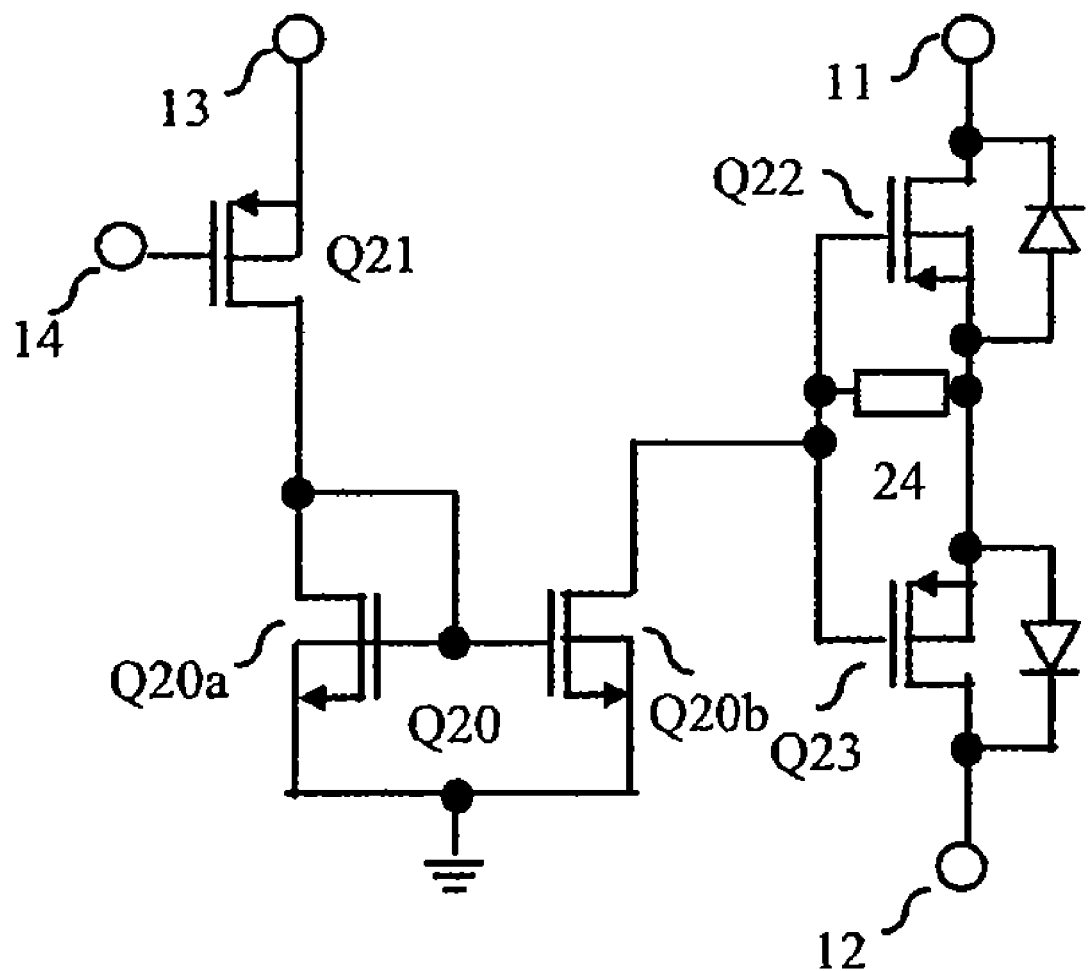
FIG. 1 is a circuit diagram showing the configuration of a conventional semiconductor switch circuit.

In the above embodiments, examples have been described in which the present invention is applied to a semiconductor switch circuit connected to a power supply IC that receives USB data, but the present invention may also be applied to a semiconductor integrated circuit that performs on/off switching. For example, the present invention can be applied instead of the conventional semiconductor switch circuit shown in FIG. 1, and general application is possible to analog switch circuits of all kinds.

In the above embodiments, the term "semiconductor switch circuit" has been used for ease of explanation, but a term such as "analog switch circuit," "switch element," or the like may, of course, also be used.

The circuit sections configuring the above-described semiconductor switch circuits, such as the number of stages or type of inverter gates, are not limited to those described in those embodiments, and it goes without saying that various kinds of compensating transistors may be added to these semiconductor switch circuits.

A semiconductor switch circuit according to the present invention enables current consumption to be reduced, and can be applied to semiconductor integrated circuits in general as an analog switch circuit.

What is claimed is:

1. A semiconductor switch circuit comprising:
   first and second MOS transistors for conduction that share a source and are connected in series between a first input/output terminal and second input/output terminal;
   a first inverter having high-potential-side power supply connected to a source and back gate of said first MOS transistor, and having output connected to a gate of said first MOS transistor;
   a second inverter having high-potential-side power supply connected to a source and back gate of said second MOS transistor, and having output connected to a gate of said second MOS transistor; and
   a control terminal connected to inputs of said first and second inverters.

2. The semiconductor switch circuit according to claim 1, wherein said first and second inverters have a CMOS inverter structure configured with a P-type MOS transistor and N-type MOS transistor.

3. The semiconductor switch circuit according to claim 1, wherein said first inverter is configured with a NOR gate.

4. The semiconductor switch circuit according to claim 1, wherein said second inverter is configured with a NOR gate.

5. The semiconductor switch circuit according to claim 1, wherein said first inverter is configured with a NAND gate.

6. The semiconductor switch circuit according to claim 1, wherein said second inverter is configured with a NAND gate.

* * * * *